United States Patent [19]

Nakagawa et al.

[11] Patent Number: 4,888,304

[45] Date of Patent: Dec. 19, 1989

[54] METHOD OF MANUFACTURING AN SOI-TYPE SEMICONDUCTOR DEVICE

[75] Inventors: Kaoru Nakagawa, Hyogo; Yoshio Yamamoto; Nobutaka Matsuoka, both of Yokohama, all of Japan

[73] Assignee: Kabushiki Kaisha Toshiba, Kawasaki, Japan

[21] Appl. No.: 943,862

[22] Filed: Dec. 22, 1986

Related U.S. Application Data

[62] Division of Ser. No. 774,929, Sep. 11, 1985, abandoned.

[30] Foreign Application Priority Data

Sep. 19, 1984 [JP] Japan ............................ 59-194600

[51] Int. Cl.⁴ ............................................ H01L 21/20
[52] U.S. Cl. ............................ 437/86; 148/DIG. 12; 148/DIG. 135; 357/15; 437/946; 437/974; 437/925; 437/84
[58] Field of Search ...... 148/1.5, DIG. 12, DIG. 135; 29/576 W, 576 E, 578; 357/15, 89, 4, 23.7, 49; 437/84, 243, 244, 946, 86, 974, 925

[56] References Cited

U.S. PATENT DOCUMENTS

| | | | |
|---|---|---|---|
| 3,239,908 | 3/1966 | Nakamura | 148/DIG. 12 |
| 3,351,502 | 11/1967 | Rediker | 148/DIG. 12 |
| 3,416,224 | 12/1968 | Armstrong | 357/49 |
| 3,508,980 | 4/1970 | Jackson Jr. et al. | 148/DIG. 12 |
| 3,602,781 | 8/1971 | Hart | 357/15 |
| 3,749,987 | 7/1973 | Anantha | 357/15 |
| 3,836,991 | 9/1974 | Portnoy et al. | 357/15 |
| 3,900,344 | 8/1975 | Magdo | 357/15 |
| 3,944,447 | 3/1976 | Magdo et al. | 357/49 |
| 4,017,341 | 4/1977 | Suzuki et al. | 357/49 |
| 4,045,248 | 8/1977 | Shannon et al. | 357/15 |
| 4,127,860 | 11/1978 | Beelitz et al. | 357/49 |
| 4,216,491 | 8/1980 | Matsuda et al. | 357/49 |
| 4,282,538 | 8/1981 | Beelitz et al. | 357/49 |
| 4,638,552 | 1/1987 | Shimbo et al. | 29/576 W |
| 4,649,627 | 3/1987 | Abernathey et al. | 437/84 |

OTHER PUBLICATIONS

Ghandhi, *VLSI Fabrication Principles,* New York; John Wiley & Sons, Inc., 1983.

Smith, "Britain getting its act together in SOI Technology in bid to get jump on VS and Japanese Chip Makers", Electronics Week, Aug. 6, 1984, pp. 31–33.

Kimura et al., "Epitaxial Film Transfer Technique for Producing Single Crystal Si Film on Ar Insulating Substrate", Appl. Phys. Lett. vol. 43, No. 3, Aug. 1, 1983, pp. 263–265.

*Primary Examiner*—Brian E. Hearn
*Assistant Examiner*—Mary Anne Wilczewski
*Attorney, Agent, or Firm*—Finnegan, Henderson, Farabow, Garrett, and Dunner

[57] ABSTRACT

The present semiconductor device comprises a first semiconductor substrate, an oxide film formed on the substrate and a second semiconductor substrate bonded to the oxide film. In particular, the semiconductor substrate further has a monocrystalline silicon layer which is formed by an epitaxial growth method on the second semiconductor substrate. Circuit elements are formed within the monocrystalline silicon layer.

13 Claims, 1 Drawing Sheet

METHOD OF MANUFACTURING AN SOI-TYPE SEMICONDUCTOR DEVICE

This application is a division, of application Ser. No 774,929, filed Sept. 11, 1985 abandoned.

BACKGROUND OF THE INVENTION

This invention relates to a semiconductor device and, in particular, an SOI (Silicon on Insulator) type semiconductor device.

Where a semiconductor device, such as a bipolar IC, is to be manufactured, it is the common practice to initially prepare a semiconductor substrate of one conductivity type. The surface area of the substrate is divided into a number of minute element areas, for example, by field insulation layers. Circuit elements, such as bipolar transistors, are formed in the element areas. In order to obtain bipolar transistors having excellent performances, it is important to decrease the resistivity of the element regions acting as the base, collector and emitter of the transistors and to electrically and sufficiently isolate the element areas of one transistor from that of another transistor.

For a decrease in the resistivity of the element regions, the so-called "embedding" technique is known in which the diffusion regions of a high impurity concentration are formed in the surface area of a substrate and an epitaxial growth layer is formed on the diffusion regions and the substrate. The element regions of circuit elements, e.g., bipolar transistors, are formed in the epitaxial growth layer and in contact with the diffusion regions. For the element isolation, the so-called "pn junction" technique is known in which a diffusion layer is provided to form a pn junction between adjacent element areas. These element areas are electrically insulated by means of reverse biasing the pn junction.

However, the above-mentioned "embedding" technique and "pn junction" technique have the following drawbacks. First, the "embedding" technique requires a greater number of manufacturing steps, as well as a greater deal of time, in embedding the diffusion regions of a high impurity concentration within a semiconductor body. Furthermore, a countermeasure must be taken to prevent an upward diffusion of an impurity from the embedded layer and thus a corresponding increase of its occupation area during the formation of an epitaxial growth layer. In the "pn junction" technique, on the other hand, more manufacturing steps and more time are needed in the formation of a diffusion layer for a pn junction. The use of this technique increases a parasitic capacitance in place of electrically isolating the element areas from each other. Furthermore, the "pn junction" technique is not suitable for the manufacture of ICs for high frequency, because the increase of the parasitic capacitance entails a degradation in the high frequency characteristic of the circuit elements.

In a high-integrated semiconductor device, in particular, a bipolar IC, not only the above-mentioned technique but also, for example, an SOS (Silicon on Sapphire) technique has already been known in the art. The SOS technique involves the use of expensive sapphire. Therefore, the manufacturing cost is hard to reduce by high integration.

The SOI (Silicon on Insulator) technique is now at the developmental stage. In this technique, an oxide film is formed on the surface of a semiconductor substrate and an epitaxial growth layer is formed on the oxide film. However, such a structure is not reduced in practice in the fabrication of an integrated circuit with a high integration density.

SUMMARY OF THE INVENTION

It is accordingly the object of this invention to provide a semiconductor device which can manufacture circuit elements with high reliability, without utilizing the so-called "embedding" or "pn junction" techniques, yet which is reduced in manufacturing cost as well as being a high integration density.

According to this invention, there is provided a semiconductor device comprising a semiconductor body, an insulation layer formed on the semiconductor body and a substrate layer including a first semiconductor layer formed on the insulation layer and a second semiconductor layer of a monocrystalline type formed by an epitaxial growth method on the first semiconductor layer.

In this semiconductor device, the first semiconductor layer overlies the semiconductor body with an insulation layer therebetween and the second semiconductor layer is formed on the surface of the first semiconductor layer. The second semiconductor layer can be formed by the epitaxial growth method to have an exact thickness. Where a plurality of circuit elements is formed within the semiconductor layer, therefore, no variation occurs in the characteristics of circuit elements. In the epitaxial growth method, the second semiconductor layer can be formed as a very thin layer. For this reason, a plurality of element regions are formed within the second semiconductor layer in a manner to have a junction with the first semiconductor layer, so that, even if the element regions are in contact with each other, a current can flow through the first semiconductor layer, thereby reducing a substantial resistivity in the element regions. Where the substrate layer is etched on the insulation layer to have a plurality of separate element areas, the element areas are electrically insulated in a satisfactory fashion. Even where the circuit elements for high frequency are formed within the element area, there is no risk that the element characteristics will be prominently degraded due to an adverse influence from the parasitic capacitance.

DETAILED DESCRIPTION OF THE PREFERRED EMBODIMENT

Figure 1A:
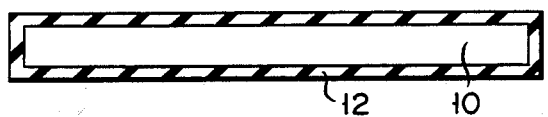
FIGS. 1A to 1C are views showing the steps of manufacturing a semiconductor device according to one embodiment of this invention.
Figure 1B:
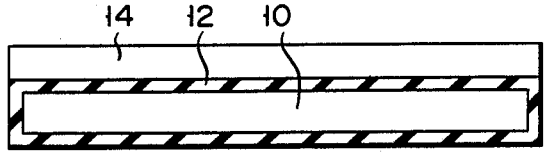
Figure 1C:

A semiconductor device according to one embodiment of this invention will be explained below with reference to FIGS. 1A to 1C. FIGS. 1A to 1C show the steps of manufacturing an SOI-type semiconductor device. First, a first semiconductor substrate 10 of, for example, silicon is prepared in the manufacture of the semiconductor device. The semiconductor substrate 10, after being mirror finished, is thermally oxidized to form an oxide film 12 of a uniform thickness on the surface of the semiconductor substrate 10. The oxide film 12 completely covers the whole surfaces of the semiconductor substrate 10 as shown in FIG. 1A. A second semiconductor substrate 14 of, for example, silicon, is so formed as to have a mirror-finished bottom surface and placed on the oxide film 12 on the mirror-finished portion of the first semiconductor substrate 10. The oxide film 12 and semiconductor substrate 14 are externally supported by mechanical pressure so that they make contact with each other. In this state, the second semiconductor substrate 14 and oxide film 12 are heat treated in an oxygen atmosphere. After the treatment, the oxide film is fixedly attached to the semiconductor substrate 14, as shown in FIG. 1B.

Then, the upper surface of the second semiconductor substrate is mirror finished by, for example, a lapping method. A monocrystalline silicon layer 16 shown in FIG. 1C is formed by the epitaxial growth method to have a uniform thickness. The monocrystalline silicon layer 16 is set so as to have a resistivity of, for example, 0.1 $\Omega$cm and a thickness of 1$\mu$m.

In the semiconductor device so formed, the silicon substrate 14 is formed on the insulation film or oxide film 12 and the monocrystalline silicon layer 16 for the formation of circuit elements is formed on the surface of the silicon substrate 14. In other words, the semiconductor structure is of an SOI-type. The semiconductor device is manufactured, for example, as a wafer which is divided by a dicing step to a plurality of chips. Where the semiconductor device is utilized to manufacture a plurality of circuit elements, the monocrystalline silicon layer 16 and second semiconductor substrate 14 are partially removed by an etching treatment. By this etching treatment, the specific portions of the oxide film 12 are completely exposed and thus the monocrystalline silicon layer 16, together with the second semiconductor substrate 14, is divided into a plurality of element areas. Element regions are formed within the areas.

According to the semiconductor device, the element regions in each area are electrically and satisfactorily isolated from ones in the other areas. Thus, it is not necessary to use the "pn junction" technique for the purpose of providing an electrical isolation among the element regions. By so doing, the integration density of the semiconductor device can be increased without degenerating the element characteristics. If a substrate of a high impurity concentration type is used as the second semiconductor substrate 14, element regions of a low resistivity are implemented without using the "embedding" technique.

The manufacturing steps of a twin Schottky diode circuit will be explained with reference to FIGS. 2A to 2D. In the manufacture of the twin Schottky diode the above-mentioned semiconductor device is prepared. In the semiconductor device, for example, a first semiconductor substrate 10 is 75 mm in diameter and 400 $\mu$m in thickness. The oxide film 12 is formed so as to have a thickness of 2$\mu$m. The second semiconductor substrate 14 is of a n$^{++}$ conductivity type and has a resistivity of $2\times10^{-3}$ $\Omega$cm, a diameter of 75 mm, a thickness of 250 $\mu$m and Miller indices of (1,1,1). The oxide film 12 and second semiconductor substrate 14 are heat treated in an oxygen atmosphere for two hours at 1100° C. to provide an integral unit. This thermal process undesirably forms an oxide film on the surface of the second semiconductor substrate 14, however this oxide film is removed from the upper surface of the second semiconductor substrate 14 by a lapping step thereafter. In the lapping step, the semiconductor substrate 14 is removed down to a thickness of 10 $\mu$m, taking into consideration the incorporation of the semiconductor device into a small package. The n-type monocrystalline silicon layer 16 is formed by an epitaxial growth method after the lapping step and has a resistivity of 0.1 $\Omega$cm and a thickness of 1 $\mu$m.

Figure 2A:
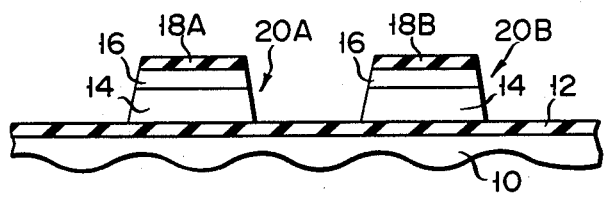
FIGS. 2A to 2D are views showing the steps of manufacturing a twin Schottky diode using the semiconductor device of FIG. 1C.

After the semiconductor device has been so prepared, a 0.6 $\mu$m-thick oxide film, not shown, is wholly formed by the thermal oxide method on the monocrystalline silicon layer 16 shown in FIG. 1C. The oxide film is selectively etched by a photoetching step to form oxide pattern 18A, 18B as shown in FIG. 2A. The monocrystalline silicon layer 16 and second semiconductor substrate 14 are subjected to, for example, a plasma etching step with the oxide pattern 18A, 18B as a mask. This plasma etching step is continued until the oxide film is exposed as shown in FIG. 2A. The remaining monocrystalline silicon layer 16 and second semiconductor substrate 14 forms element areas 20A, 20B.

Figure 2B:
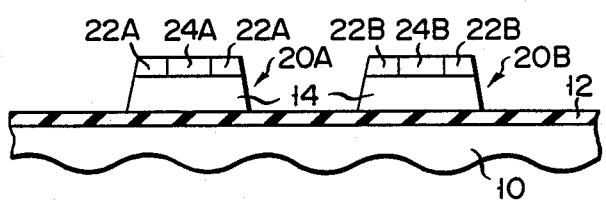

The oxide pattern 18A, 18B is removed to expose the n-type monocrystalline silicon layer 16. Then, a photoresist layer, not shown, is formed to cover the element areas 20A, 20B and oxide film 12. The photoresist layer is photoetched on the element areas 20A and 20B and, with the remaining photoresist layer as a mask, n-type impurities are diffused within the monocrystalline layer 16. As shown in FIG. 2B, n$^{+}$-type diffusion regions 22A, 22B are formed around n-type regions 24A, 24B. Then, the photoresist layer, not shown, is removed.

Figure 2C:
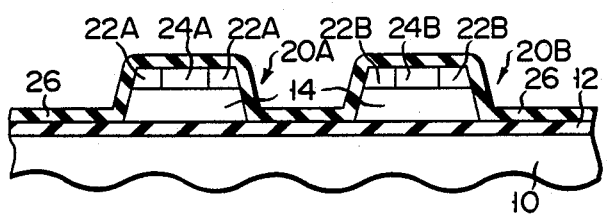
Figure 2D:
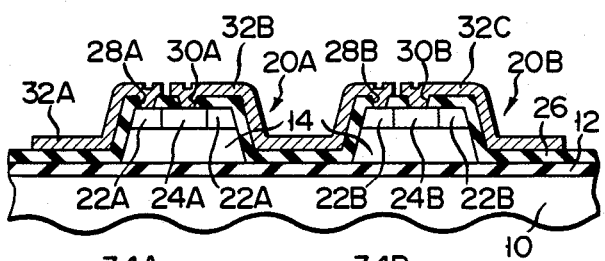

An oxide layer 26 as shown in FIG. 2C is formed with a thickness of 0.4 $\mu$m, by the thermal oxidation method and low-temperature oxidation method, to cover the n$^{+}$-type regions 22A, 22B, n-type regions 24A, 24B, n$^{++}$-type semiconductor substrate 14 and oxide film 12. The oxide film 26 is partially removed from the n$^{+}$-type regions 22A, 22B and n-type regions 24A, 24B, thereby forming windows 28A, 28B, 30A, 30B as shown in FIG. 2D. Then, an Mo/Al layer 34 is formed by a sputtering step on the oxide film 26 to be in contact with the n$^{+}$-type regions 22A, 22B and n-type regions 14A, 24B. The Mo/Al layer 34 is subjected to a patterning step to form electrodes 32A, 32B and 32C. The n$^{+}$-type regions 22A and 22B are made in ohmic contact with the electrodes 32A and 32B, respectively, and the n-type regions 24A and 24B are made in Schottky contact with the electrodes 32B and 32C, respectively.

Figure 3:
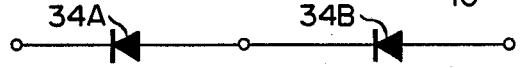
FIG. 3 shows an equivalent circuit showing a twin Schottky diode circuit as shown in FIG. 2D.

FIG. 3 shows an equivalent circuit of a twin Schottky diode circuit shown in FIG. 2D. The first Schottky diode 34A is formed within the element area 20A shown in FIG. 2D and the second Schottky diode 34B is formed within the element area 20B shown in FIG. 2D. The first Schottky diode 34A is connected in series with the second Schottky diode 34B through the electrode 32B in FIG. 2D.

In the twin Schottky diode circuit of FIG. 2D, the element areas 20A, 20B are almost completely isolated by the oxide films 12 and 26. The parasitic capacitance of the twin Schottky diode is, therefore, smaller. According to this invention it is possible to reduce the parasitic capacitance to one third the parasitic capacitance involved in the conventional diode structure including the first and second Schottky diodes electrically isolated from each other by the "pn junction" technique. The arrangement of this embodiment can reduce the resistivity of element regions forming the Schottky diodes 34A and 34B. Now consider, for example, the Schottky diode 34A in particular. The electrode 32B is formed in Schottky contact with the upper surface of the n-type region 24A and the n++-type semiconductor substrate 14 is formed in contact with the undersurfaces of the n-type region 24A and n+-type region 22A. In this embodiment, the n-type region 24A is in contact with the n+-type region 22A in the lateral direction. However, the current supplied from the electrode 32B flows into the electrode 32A through the n-type region 24A, n++-type semiconductor substrate 14 and n+-type region 22A. This is because the Schottky contact portion is located at a very small distance of 1 $\mu$m (i.e., the thickness of the n-type region 24A) with respect to the n++-type semiconductor substrate 14 and because the resistance of the n++-type semiconductor substrate 14 is smaller than that of the n-type region 24A. The Schottky contact portion must be set at a distance of 5 $\mu$m with respect to the n+-type region 22A in view of a possible mask alignment error, noting that this value is the same as that in the conventional semiconductor structure. In this embodiment, the n++-type semiconductor substrate 14 is located beneath the n-type region 24A. In the conventional semiconductor structure, on the other hand, an area corresponding to the substrate 10 has been set at a lower impurity concentration level. For this reason, the conventional structure cannot provide any lower element resistivity than that of this embodiment.

According to this embodiment, a semiconductor device of a high integration density can be provided without utilizing the "pn junction" technique for separation between the element areas and "embedding" technique for reducing the resistance within the element area. Furthermore, it is possible to obtain the semiconductor device having a smaller parasitic capacitance and excellent high frequency/switching characteristics. According to this invention, it is also possible to manufacture an SOI-type semiconductor device at low costs without using any expensive material, such as sapphire. Since the monocrystalline silicon layer is formed by the epitaxial growth method on the second semiconductor substrate and thus the thickness of the monocrystalline silicon layer can be accurately controlled through the use of the epitaxial growth method, the monocrystalline silicon layer is formed as a layer having a uniform thickness. Where a plurality of circuit elements, such as transistors, is formed within the monocrystalline silicon layer, the element characteristic do not vary from transistor to transistor. Now suppose that, for example, the circuit elements are formed within an already lapped semiconductor substrate. In this case, the element characteristic varies from transistor to transistor, because the lapping step cannot exactly control the thickness of the semiconductor substrate. Furthermore, according to this invention the upper surface of the oxide film on the first semiconductor substrate and the bottom surface of the second semiconductor substrate are both mirror finished and then bonded to each other by the heat treatment. For this reason, they are not readily separated from each other due to a relatively greater bond force exerted on their bonded area when, for example, a thermal stress is applied thereto.

Although, in the above-mentioned embodiment, the twin Schottky diode circuit has been manufactured through the utilization of the semiconductor device (FIG. 1C), this invention can also be applied to the manufacture of, for example, a PIN diode, variable capacitance diode, transistor for use in a high frequency range, and their composite elements.

What is claimed is:

1. A method of manufacturing an SOI-type semiconductor device, comprising the steps of:
    preparing first and second monocrystalline semiconductor substrates of the same material, each of said first and second substrates having a top face and a bottom face;
    providing said top face of said first substrate and said bottom face of said second substrate with a mirror finish;
    thermally oxidizing said mirror-finished top face of said first substrate to provide said top face of said first substrate with a dielectric surface of a substantially uniform thickness;
    stacking said first and second substrates on one another with said dielectric-surfaced top face of said first substrate in contact with said mirror-surfaced bottom face of said second substrate;
    heating said stacked first and second substrates in an oxygen-containing atmosphere to bond said first and second substrates together; and
    forming an epitaxial layer of semiconductor material on said top face of said second substrate after said heating step.

2. The method according to claim 1, wherein said mirror-finish providing step includes lapping said top face of said first substrate and said bottom face of said second substrate.

3. The method according to claim 1, wherein said epitaxial layer forming step includes lapping said top face of said second substrate and forming an epitaxial layer of monocrystalline semiconductor material on said lapped top face of said second substrate.

4. The method according to claim 3, wherein said epitaxial layer is monocrystalline silicon.

5. The method according to claim 1, further comprising the step of removing pre-selected portions of said epitaxial layer and said second substrate to form a plurality of element areas on said dielectric surface of said first substrate.

6. The method according to claim 5, wherein said removing step includes selectively etching said epitaxial layer and said second substrate to expose portions of said dielectric surface of said first substrate.

7. The method according to claim 1, wherein said second substrate has the same conductivity as said epitaxial layer and a higher impurity concentration than that of said epitaxial layer.

8. A method of manufacturing an SOI-type semiconductor device, comprising the steps of:
    preparing first and second monocrystalline semiconductor substrates of the same material, each of said first and second substrates having a top face and a bottom face;
    providing said top face of said first substrate and said bottom face of said second substrate with a mirror finish;
    thermally oxidizing said mirror-finished top face of said first substrate to provide said top face of said first substrate with a dielectric surface of a substantially uniform thickness;
    stacking said first and second substrates on one another with said dielectric-surfaced top face of said first substrate in contact with said mirror-surfaced bottom face of said second substrate;
    heating said stacked first and second substrates in an oxygen-containing atmosphere to bond said first and second substrates together;

forming an epitaxial layer of semiconductor material on said top face of said second substrate after said heating step;

removing pre-selected portions of said epitaxial layer and said second substrate to form first and second element areas on said dielectric surface of said first substrate, said first and second element areas respectively including first and second remaining epitaxial layer portions overlying first and second remaining second substrate portions; and forming first and second Schottky diodes in said first and second element areas, respectively.

9. The method according to claim 8, wherein said second substrate has the same conductivity as said epitaxial layer and a higher impurity concentration than that of said epitaxial layer.

10. The method according to claim 8, wherein said Schottky diode forming step includes forming a pair of electrodes each in Schottky contact with one of said first and second remaining epitaxial layer portions.

11. The method according to claim 8, wherein said Schottky diode forming step includes:

forming first and second diffusion regions in said first and second remaining epitaxial layer portions, respectively, said first and second diffusion regions respectively contacting said first and second remaining second substrate portions; and forming a series-connecting electrode in Schottky contact with a region of said first remaining epitaxial portion outside said first diffusion region and in ohmic contact with said second diffusion region.

12. The method according to claim 11, wherein said electrode forming step further includes forming a first terminal electrode in ohmic contact with said first diffusion region and a second terminal electrode in Schottky contact with a region of said second remaining epitaxial portion outside said second diffusion region.

13. The method of claim 11, wherein said second substrate is of $n^{++}$ conductivity, said diffusion regions are of $n^{+}$ conductivity, and said regions of said remaining epitaxial portions outside said diffusion regions are of n conductivity.

* * * * *